United States Patent
Ko

(10) Patent No.: US 9,583,708 B2
(45) Date of Patent: Feb. 28, 2017

(54) MASK FOR DEPOSITION, MASK ASSEMBLY INCLUDING THE SAME AND METHOD OF FORMING THE MASK ASSEMBLY

(71) Applicant: Samsung Display Co., Ltd., Yongin, Gyeonggi-Do (KR)

(72) Inventor: Jung-Woo Ko, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 153 days.

(21) Appl. No.: 14/291,276

(22) Filed: May 30, 2014

(65) Prior Publication Data

US 2015/0034005 A1 Feb. 5, 2015

(30) Foreign Application Priority Data

Jul. 30, 2013 (KR) ........................ 10-2013-0090362

(51) Int. Cl.
*B05C 21/00* (2006.01)
*H01L 51/00* (2006.01)
*C23C 14/04* (2006.01)

(52) U.S. Cl.
CPC ........ *H01L 51/0011* (2013.01); *B05C 21/005* (2013.01); *C23C 14/042* (2013.01); *Y10T 29/49826* (2015.01)

(58) Field of Classification Search
None
See application file for complete search history.

(56) References Cited

U.S. PATENT DOCUMENTS

| 7,253,533 | B2* | 8/2007 | Ko | ........................ | C23C 14/042 |
| | | | | | 257/797 |
| 2011/0265714 | A1* | 11/2011 | Lee | ........................ | C23C 14/04 |
| | | | | | 118/504 |
| 2012/0266813 | A1* | 10/2012 | Hong | ........................ | C23C 14/044 |
| | | | | | 118/505 |

FOREIGN PATENT DOCUMENTS

| KR | 1020110104793 A | 9/2011 |
| KR | 1020110120700 A | 11/2011 |
| KR | 1020120022135 A | 3/2012 |

\* cited by examiner

*Primary Examiner* — Dah-Wei D Yuan
*Assistant Examiner* — Jethro M Pence
(74) *Attorney, Agent, or Firm* — Cantor Colburn LLP

(57) ABSTRACT

A mask for deposition includes a mask main body extended in a first direction and having a first thickness, and including ends opposite to each other in the first direction and supported by a frame while a tensile force is applied to the mask in the first direction; and a plurality of active patterns separated from each other in the first direction in a center area of the mask main body, and having a second thickness less than the first thickness.

8 Claims, 7 Drawing Sheets

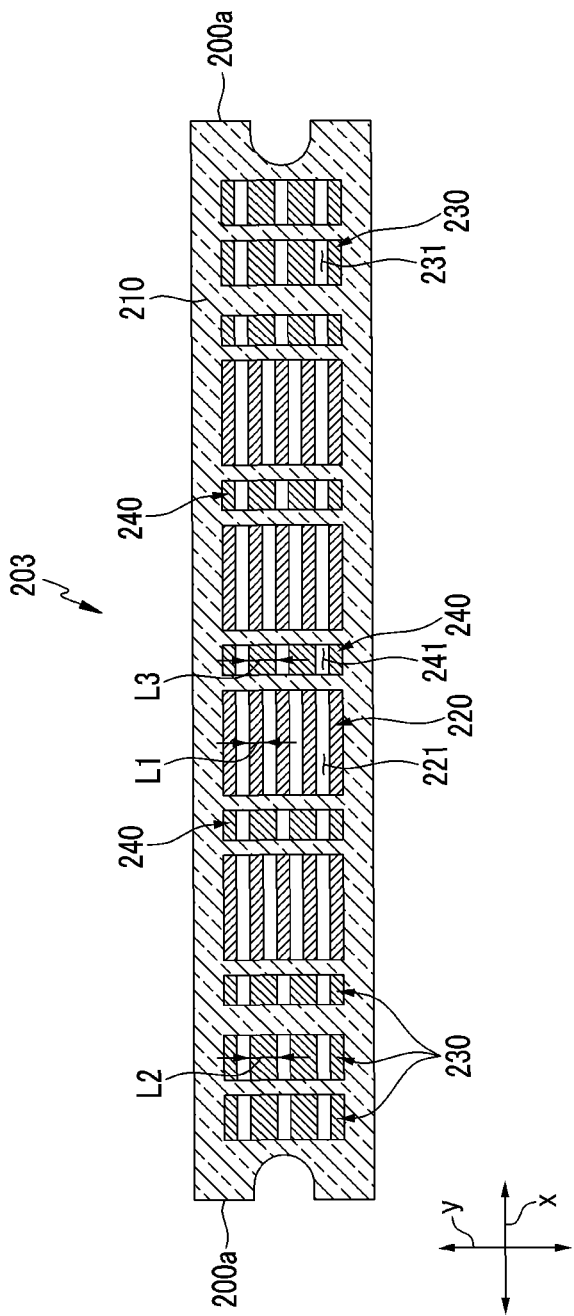

MASK FOR DEPOSITION, MASK ASSEMBLY INCLUDING THE SAME AND METHOD OF FORMING THE MASK ASSEMBLY

This application claims priority to Korean Patent Application No. 10-2013-0090362 filed on Jul. 30, 2013, and all the benefits accruing therefrom under 35 U.S.C. §119, the entire contents of which are incorporated herein by reference.

BACKGROUND (a) Field

The invention relates to a mask and a mask assembly. More particularly, the invention relates to a mask used for depositing an organic layer, and a mask assembly.

(b) Description of the Related Art

Generally, as a representative example of a flat panel display, there are an organic light emitting display, a liquid crystal display, a plasma display panel, etc.

Among these, in order to manufacture the organic light emitting display, an electrode having a specific pattern, an organic emission layer, etc., are formed. The method for forming the electrode and the organic emission layer, etc., can be performed such as by a deposition method using a mask assembly.

More specifically, the organic light emitting display includes pixels that are a basic unit displaying images arrayed in a matrix form on a substrate, and an organic light emitting diode that has an anode, a first electrode, a cathode and a second electrode that are sequentially disposed with organic emission layers each emitting colored light such as red, green, blue or white colors, for each pixel. Organic materials of the organic emission layer are very vulnerable to moisture, oxygen, etc., such that thorough isolation thereof from moisture is employed during a process of forming the organic emission layer and after forming the organic emission layer. Therefore, performing patterning using a general photolithography process may be difficult. Consequently, the organic emission layer is formed using a mask in which pattern openings for penetrating deposition materials only through portions corresponding to each pattern thereof are defined.

SUMMARY

One or more exemplary embodiment of the invention provides a mask for deposition which controls deformation of an active pattern of the mask from a tensile force applied to the mask, and a mask assembly including the mask for deposition.

An exemplary embodiment provides a mask for deposition, including: a mask main body extended in a first direction and having a first thickness, and including ends opposite to each other in the first direction and supported by a frame while a tensile force is applied to the mask in the first direction; and a plurality of active patterns separated from each other in the first direction in a center area of the mask main body, and having a second thickness less than the first thickness.

The mask may further include a first dummy pattern between an outermost active pattern in the first direction among the plurality of active patterns and an end of the mask main body, and having a third thickness between the first thickness and the second thickness.

The mask may further include a plurality of first dummy patterns between an outermost active pattern in the first direction among the plurality of active patterns and an end of the mask main body, and having a third thickness between the first thickness and the second thickness.

A plurality of active openings may be defined in an active pattern among the plurality of active patterns, a plurality of first dummy openings may be defined in the first dummy pattern, and a first distance between neighboring active openings is less than a second distance between neighboring first dummy openings.

The mask may further include a second dummy pattern between neighboring active patterns among the plurality of active patterns.

The second dummy pattern may have the second thickness.

The second dummy pattern may have the third thickness.

The mask may further include a plurality of second dummy patterns respectively between neighboring active patterns from among the plurality of active patterns.

A plurality of active openings may be defined in an active pattern among the plurality of active patterns, a plurality of second dummy openings may be defined in the second dummy pattern, and a first distance between the neighboring active openings is less than a third distance between neighboring second dummy openings.

Another exemplary embodiment provides a mask assembly including: a frame, and an opening defined in the frame; and at least one mask where the plurality of active patterns overlaps the opening in the frame when the mask ends opposite to each other in the first direction are supported by the frame while the tensile force is applied to the mask in the first direction.

The mask assembly may further include a plurality of masks arranged in a second direction crossing the first direction, where the plurality of active patterns of the plurality of masks overlaps the opening in the frame.

According to one or more exemplary embodiment, the mask for deposition controls deformation of the active pattern thereof from a tensile force applied to the mask, and the mask assembly including the mask for deposition, are provided. The mask main body has a thickness that is greater than a thickness defined by the active pattern of the mask, so rigidity of the mask main body is improved. A first dummy pattern is provided between the outermost active pattern and the end of the mask main body in a length direction of the mask, and a second dummy pattern is provided between adjacent active patterns, each of the dummy patterns having a smaller thickness than that of the mask main body, so tensile force applied to the active pattern is spread or absorbed by the first and/or second dummy pattern and deformation of the active pattern by the tensile force applied to the mask in a length direction of the mask is controlled.

BRIEF DESCRIPTION OF THE DRAWINGS

The above and other features of this disclosure will become more apparent by describing in further detail exemplary embodiments thereof with reference to the accompanying drawings, in which:

FIG. 7 is a top plan view of still another exemplary embodiment of a mask according to the invention.

DETAILED DESCRIPTION

Figure 1:
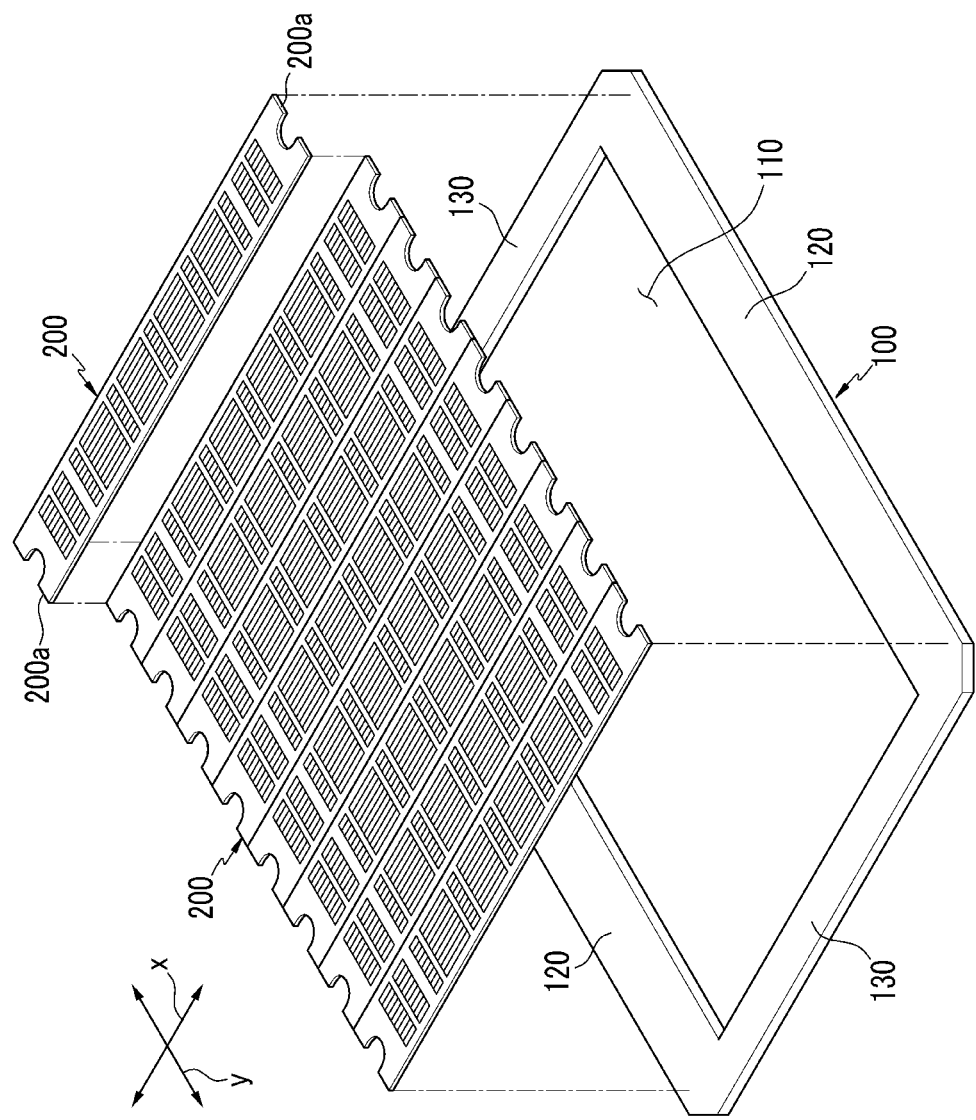
FIG. 1 is an exploded perspective view of an exemplary embodiment of a mask assembly according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

Accordingly, the drawings and description are to be regarded as illustrative in nature and not restrictive. Like reference numerals designate like elements throughout the specification. As used herein, the term "and/or" includes any and all combinations of one or more of the associated listed items.

In various exemplary embodiments, the same reference numerals are used for elements having the same configurations and will be representatively described in one exemplary embodiment, and in other exemplary embodiments, only elements different from those of the one exemplary embodiment will be described.

The size and thickness of each component illustrated in the drawings are arbitrarily illustrated in the drawings for better understanding and ease of description, but the invention is not limited to the illustrations.

In the drawings, the thickness of layers, films, panels, regions, etc., are exaggerated for clarity. The thickness of the layers, films, panels, regions, etc., is enlarged in the drawings for better understanding and ease of description. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Throughout this specification, it is understood that the term "on" and similar terms are used generally and are not necessarily related to a gravitational reference.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A method for forming an electrode, an organic emission layer, etc., of an organic light emitting display can be employed using a deposition method using a mask assembly.

A mask assembly including a frame with openings, and a plurality of masks in a band shape of which both ends are fixed to the frame, corresponding to the openings, has been used. A mask may be fixed to the frame by applying tensile force to the mask. However, the shape of pattern openings defined in the mask may be deformed due to the tensile force applied to the mask. Therefore, an improved mask assembly which reduces or effectively prevents deformation of a shape of pattern openings defined in the mask, is desired.

Hereinafter, the invention will be described in detail with reference to the accompanying drawings.

A mask assembly according to the invention will now be described with reference to FIG. 1 to FIG. 4.

Figure 2:
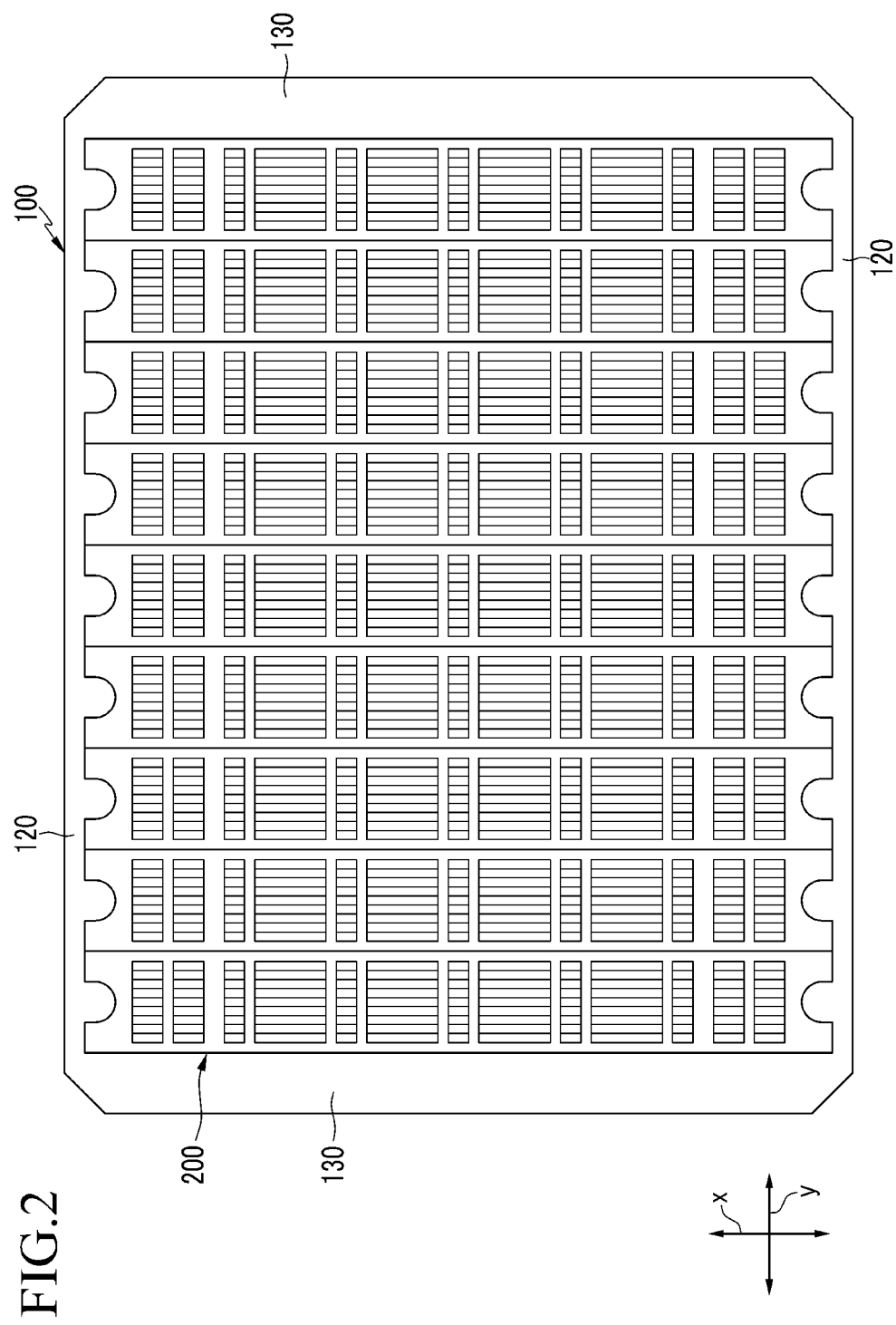
FIG. 2 is a top plan view of the mask assembly in FIG. 1.

FIG. 1 is an exploded perspective view of an exemplary embodiment of a mask assembly according to the invention. FIG. 2 is a top plan view of the mask assembly in FIG. 1.

As shown in FIG. 1 and FIG. 2, the mask assembly includes a frame 100 and a plurality of masks 200.

An opening 110 is defined in the frame 100. The frame 100 fixes and supports respective ends of each of the plurality of masks 200. The opening 110 in frame 100 exposes the masks 200 when the masks 200 are fixed to and supported by the frame 100. The frame 100 includes a pair of first supports 120 facing each other in a first direction (x) with the opening 110 therebetween, and a pair of second supports 130 facing each other in a second direction (y) crossing the first direction (x) with the opening 110 therebetween. Both of opposing ends 200a of a mask 200 are supported at the first support 120. In one exemplary embodiment, for example, the opposing ends 200a of the mask 200 are supported at the first support 120 of the frame 100 by using a fixing method such as welding while a tensile force is applied to the mask 200 in the first direction (x).

In the frame 100 of the illustrated exemplary embodiment of the mask assembly according to the invention, the first support 120 forms a long side of the frame 100 having a substantially quadrangular shape and the second support 130 forms a short side of the frame 100. However, in an alternative exemplary embodiment, the frame of the mask assembly according to the invention, the first support 120 and the second support 130 may have substantially the same length.

Further, the frame in another exemplary embodiment of the mask assembly according to the invention may have a polygonal or circular shape instead of the quadrangular shape.

The mask 200 fixed to the frame 100 is supported on the frame 100 while a tensile force is applied to the mask 200 in the first direction (x), Consequently, the frame 100 receives a compressive force in the first direction (x), that is, an elongation direction of the mask 200, by the tensile force in the first direction (x) applied to the mask 200. Since the frame 100 receives a compressive force, the frame 100 may include a metal material such as stainless steel having substantial rigidity so that deformation of the frame 100 by the compressive force of the mask 200 is reduced or effectively prevented.

The mask 200 has a band or bar shape extending in the first direction (x), and the opposing ends 200a thereof are supported to the frame 100 in the state where the tensile force is applied to the mask 200 in the first direction (x). Multiple masks 200 are provided in the mask assembly, and are disposed and supported at the frame 100 in the second direction (y) crossing the first direction (x). The masks 200 may be arranged in the second direction (y) to contact each other or to be spaced apart from each other.

Figure 3:
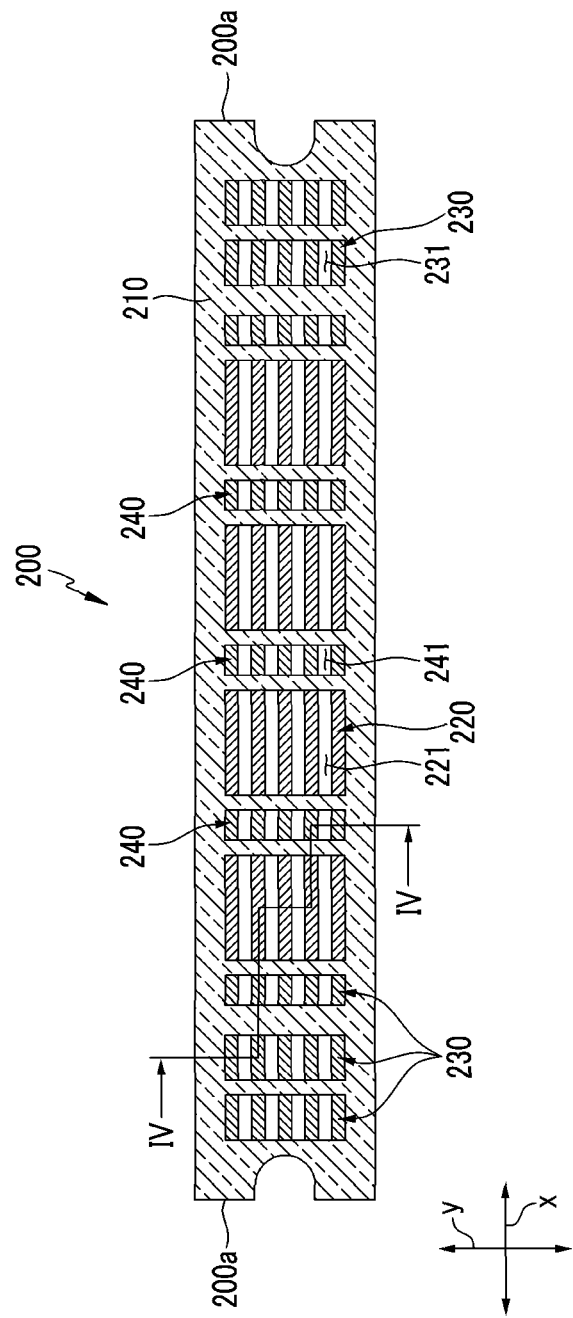
FIG. 3 is a top plan view of an exemplary embodiment of a mask included in a mask assembly according to the invention.
Figure 4:
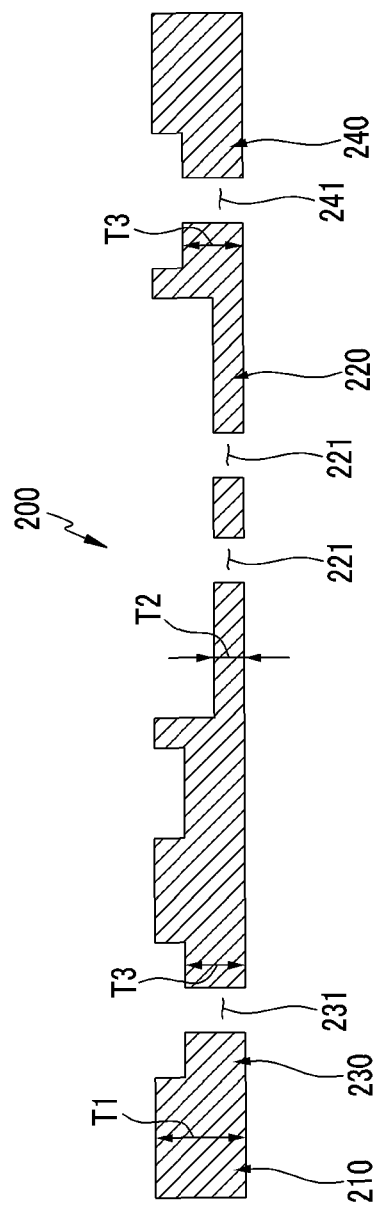
FIG. 4 is a cross-sectional view with respect to line IV-IV of FIG. 3.

FIG. 3 is a top plan view of an exemplary embodiment of a mask included in a mask assembly according to the invention. FIG. 4 is a cross-sectional view with respect to line IV-IV of FIG. 3.

As shown in FIG. 3 and FIG. 4, the mask 200 includes a mask main body 210, an active pattern 220, a first dummy pattern 230 and a second dummy pattern 240.

The mask main body 210 has a band shape that is extended in the first direction (x), is provided in the opening 110 of the frame 100 and is supported on the frame 100. A plurality of active patterns 220 that are separately disposed in a center area in the first direction (x) are formed on the mask main body 210.

The mask main body 210 has a first thickness T1. The first thickness T1 may be a maximum or overall thickness of the mask main body 210. In one exemplary embodiment, for example, the mask main body 210 can have a first thickness T1 of about 10 micrometers ($\mu m$) to about 60 $\mu m$, and the first thickness T1 can be substantially 30 $\mu m$.

A plurality of active patterns 220 of the mask 200 are separated from each other and disposed in the first direction (x). The active pattern 220 may correspond to one organic light emitting display. With the plurality of active patterns 220 in a single mask 200, multiple patterns of several organic light emitting displays can be simultaneously provided on a mother substrate, on which the organic light emitting displays will be manufactured, by a single process. That is, the active pattern 220 of the mask 200 corresponds to a deposition area of patterns configuring an organic light emitting display. The active pattern 220 includes an open pattern that penetrates a thickness of the mask 200 so that organic light emitting patterns configuring the organic light emitting display may be provided on a mother substrate through the active pattern 220. A plurality of active openings 221 that are stripe-type open patterns are defined in the mask main body 210 at the active pattern 220 includes.

The active pattern 220 is recessed from a surface of the mask main body 210, to define a second thickness T2 that is less than the first thickness T1. In one exemplary embodiment, for example, the mask 200 can have the second thickness T2 at the active pattern 220 of about 5 $\mu m$ to about 50 $\mu m$, and the second thickness T2 can be substantially 10 $\mu m$. The active pattern 220 may be defined by one or more portions of the mask main body 210 having the second thickness T2 and/or the active openings 221 defined by such portions of the mask main body 210.

The active opening 221 of the active pattern 220 of the exemplary embodiment of the mask 200 included in the mask assembly according to the invention has a stripe shape, but is not limited thereto. The active opening 221 of another exemplary embodiment of the mask included in a mask assembly according to the invention can have various shapes such as a discrete dot or polygonal shape.

A first dummy pattern 230 is provided to neighbor the active pattern 220 that is provided to an outermost side of the mask 200 in the first direction (x), from among a plurality of active patterns 220.

The first dummy pattern 230 is provided between the active pattern 220 and an end 200a of the mask main body 210. The first dummy pattern 230 can have a different shape from the active pattern 220. The first dummy pattern 230 has a shape which is recessed from the surface of the mask main body 210 to define a third thickness T3. The mask 200 has the third thickness at the first dummy pattern 230, and the third thickness T3 is between the first thickness T1 and the second thickness T2. In one exemplary embodiment, for example, mask 200 can have a third thickness T3 at the first dummy pattern 230 of about 10 $\mu m$ to about 50 $\mu m$, and the third thickness T3 can be substantially 20 $\mu m$.

The mask 200 may include multiple first dummy patterns 230. As illustrated in FIG. 3 and FIG. 4, three first dummy patterns 230 are disposed respectively between the outermost active pattern 220 and the end 200a of the mask main body 210. The first dummy patterns 230 can have different shapes.

While FIG. 3 and FIG. 4 illustrate three first dummy patterns 230, the invention is not limited thereto. In another exemplary embodiment, there can be more or less than three first dummy patterns 230 such as one, two or four first dummy patterns 230.

The first dummy pattern 230 has an open pattern that penetrates the mask 200. A plurality of first dummy openings 231 that are stripe-type open patterns is defined in the mask main body 210 at the first dummy pattern 230.

The first dummy opening 231 of the first dummy pattern 230 of the exemplary embodiment of the mask 200 included in a mask assembly according to the invention has a stripe shape, but is not limited thereto. The first dummy opening 231 of the exemplary embodiment of the mask included in a mask assembly according to invention can have various shapes such as a discrete dot or polygonal shape. The first dummy pattern 230 may be defined by one or more portions of the mask main body 210 having the third thickness T3 and/or the first dummy opening 231 defined by such portions of the mask main body 210.

The second dummy pattern 240 is provided between neighboring active patterns 220 from among the plurality of active patterns 220. The second dummy pattern 240 has an open pattern that penetrates the mask 200. A plurality of second dummy openings 241 that are stripe-type open patterns is defined in the mask main body 210 at the second dummy pattern 240. The second dummy pattern 240 may be defined by one or more portions of the mask main body 210 having the third thickness T3 and/or the second dummy openings 241 defined by such portions of the mask main body 210.

There are multiple second dummy patterns 240 which are respectively disposed between the neighboring active patterns 220.

The second dummy pattern 240 is recessed from the surface of the mask main body 210, and defines the same third thickness T3 defined by the first dummy pattern 230.

The second dummy opening 241 of the second dummy pattern 240 of the exemplary embodiment of the mask 200 included in a mask assembly according to the invention has a stripe shape, but is not limited thereto. The second dummy opening 241 of another exemplary embodiment of the mask included in a mask assembly according to the invention can have various shapes such as a discrete dot or polygonal shape.

As described above, in the exemplary embodiment of the mask 200 of a mask assembly according to the invention, the mask main body 210 has the first thickness T1 that is greater than the second thickness T2 defined by the active pattern 220 so rigidity of the mask main body 210 is improved, and deformation of the active pattern 220 by the tensile force is controlled when the tensile force is applied to the mask 200 in the first direction (x).

Further, regarding the exemplary embodiment of the mask 200 of a mask assembly according to the invention, the first dummy pattern 230 is provided between the outermost active pattern 220 and the end 200a of the mask main body 210 and has the third thickness T3 between the second thickness T2 defined by the active pattern 220 and the first thickness T1 of the mask main body 210 so when the tensile force is applied to the mask 200 in the first direction (x), the first dummy pattern 230 is substantially deformed by the tensile force, the tensile force applied to the active pattern 220 is spread or absorbed by the first dummy pattern 230, and deformation of the active pattern 220 by the tensile force applied in the first direction (x) is controlled.

In addition, regarding the exemplary embodiment of the mask 200 of a mask assembly according to the invention, the second dummy pattern 240 is provided between the neighboring active patterns 220 and defines the third thickness T3 between the second thickness T2 defined by the active pattern 220 and the first thickness T1 of the mask main body 210 so when the tensile force is applied to the mask 200 in the first direction (x), the second dummy pattern 240 is deformed by the tensile force, the tensile force applied to the active pattern 220 is spread or absorbed by the second dummy pattern 240, and deformation of the active pattern 220 by the tensile force applied in the first direction (x) is controlled.

That is, when the tensile force is applied to the mask 200 in the first direction (x), the first dummy pattern 230 is substantially deformed by the tensile force, the second dummy pattern 240 is then deformed by the tensile force spread by the first dummy pattern 230, and the tensile force applied to the active pattern 220 is again spread so deformation of the active pattern 220 used for depositing the organic layer by the tensile force applied in the first direction (x) is substantially controlled.

As described above, the exemplary embodiment of the mask 200 of a mask assembly according to the invention includes the first dummy pattern 230 and the second dummy pattern 240 that each define the third thickness T3 between the first thickness T1 of the mask main body 210 and the second thickness T2 defined by the active pattern 220 so the tensile force applied to the mask 200 when the mask 200 is fixed to the frame 100 is continuously spread by the first dummy pattern 230 and the second dummy pattern 240, and deformation of the active pattern 220 by the tensile force is controlled. That is, the mask 200 for controlling deformation of the active pattern 220 by the tensile force applied to the mask 200 and the mask assembly including the same, is provided.

A mask according to a second exemplary embodiment will now be described with reference to FIG. 5 and FIG. 6.

Parts that are different from the first exemplary embodiment will be described, and parts that are not described follow the first exemplary embodiment. For better comprehension and ease of description, the constituent elements of the second exemplary embodiment that are the same as the first exemplary embodiment will have the same reference numerals.

Figure 5:
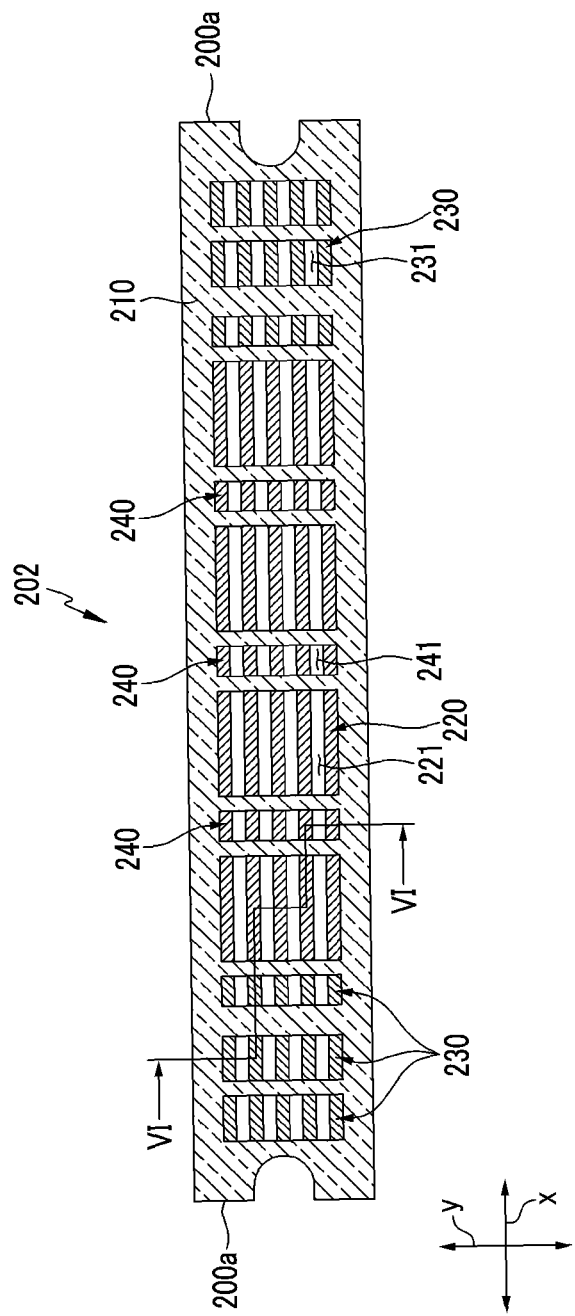
FIG. 5 is a top plan view of another exemplary embodiment of a mask according to the invention.

FIG. 5 is a top plan view of another exemplary embodiment of a mask according to the invention. FIG. 6 is a cross-sectional view with respect to line VI-VI of FIG. 5.

Figure 6:
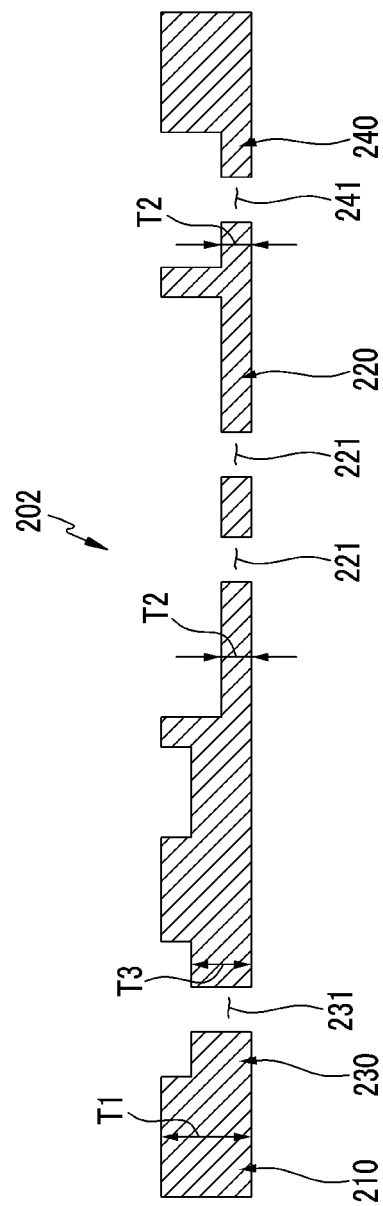
FIG. 6 is a cross-sectional view with respect to line VI-VI of FIG. 5.

As shown in FIG. 5 and FIG. 6, the mask 202 includes a mask main body 210, an active pattern 220, a first dummy pattern 230 and a second dummy pattern 240.

The second dummy pattern 240 is recessed from the surface of the mask main body 210 and to define the same second thickness T2 as the active pattern 220.

As similarly described above, regarding the exemplary embodiment of the mask 202 according to the invention, the second dummy pattern 240 is provided between the neighboring active patterns 220 and defines the same second thickness T2 as the active pattern 220 so when the tensile force is applied to the mask 202 in the first direction (x), the second dummy pattern 240 is deformed by the tensile force, the tensile force applied to the active pattern 220 is spread, and deformation of the active pattern 220 by the tensile force applied in the first direction (x) is controlled.

That is, when the tensile force is applied to the mask 202 in the first direction (x), the first dummy pattern 230 is substantially deformed by the tensile force, the second dummy pattern 240 is deformed by the tensile force spread by the first dummy pattern 230, the tensile force applied to the active pattern 220 is again spread, and deformation of the active pattern 220 used for depositing the organic layer by the tensile force applied in the first direction (x) is substantially controlled.

As described above, since the exemplary embodiment of the mask 202 according to the invention includes the second dummy pattern 240 having the same second thickness T2 as the active pattern 220, the tensile force applied to the mask 202 when the mask 202 is fixed to the frame 100 is continuously spread by the first dummy pattern 230 and the second dummy pattern 240, and deformation of the active pattern 220 by the tensile force is controlled. That is, the mask 202 for controlling deformation of the active pattern 220 by the tensile force applied to the mask 202 is provided.

A mask according to still another exemplary embodiment will now be described with reference to FIG. 7.

Parts that are different from the exemplary embodiment in FIG. 3 and FIG. 4 will be described, and any repetitive description of same parts is omitted for convenience of explanation. For better comprehension and ease of description, the same constituent elements of the exemplary embodiment in FIG. 7 as the exemplary embodiment in FIG. 3 and FIG. 4 will have the same reference numerals.

FIG. 7 is a top plan view of still another exemplary embodiment of a mask according to the invention.

As shown in FIG. 7, the mask 203 includes a mask main body 210, an active pattern 220, a first dummy pattern 230 and a second dummy pattern 240.

A gap between neighboring active openings 221 defines a first distance L1, and a gap between neighboring first dummy openings 231 defines a second distance L2. The first distance L1 is less than the second distance L2. The distance is taken perpendicular to an extension direction of the active openings 221 and first dummy openings 231.

Also, a gap between neighboring second dummy openings 241 defines a third distance L3. The first distance L1 is less than the third distance L3.

The third distance L3 can be equal to or different from the second distance L2.

As described, regarding the exemplary embodiment of the mask 203 according to the invention, the third distance L3 and the second distance L2 are respectively greater than the first distance L1 so when the tensile force is applied to the mask 203 in the first direction (x), the tensile force is spread by the first dummy pattern 230 and the second dummy pattern 240, and deformation of the active pattern 220 by the tensile force applied to the mask 203 in the first direction (x) is controlled.

That is, when the tensile force is applied to the mask 203 in the first direction (x), the tensile force is spread by the first dummy pattern 230 and the second dummy pattern 240 so deformation of the active pattern 220 for depositing the organic layer by the tensile force applied in the first direction (x) is substantially controlled.

As described above, regarding the exemplary embodiment of the mask 203 according to the invention, the tensile force applied to the mask 203 is continuously spread by the first dummy pattern 230 and the second dummy pattern 240 thereby controlling deformation of the active pattern 220 by the tensile force That is, the mask 203 for controlling deformation of the active pattern 220 by the tensile force applied to the mask 203 is provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mask for deposition, comprising:
 a mask main body defining:
 in a same plane, a length of the mask extended in a first direction and a width of the mask which is smaller than the length and extended in a second direction crossing the first direction,
 ends of the mask which are opposite to each other in the first direction to be supported by a frame while a tensile force is applied to the mask in the first direction,
 in a thickness direction perpendicular to the plane, a first thickness of the mask as a maximum thickness of the mask main body, and
 in a center area thereof, a plurality of active patterns of the mask separated from each other in the first direction, the plurality of active patterns defining a second thickness of the mask less than the first thickness,
 wherein the second thickness defined by the plurality of active patterns defines a plurality of active openings in an active pattern among the plurality of active patterns,
 wherein the mask main body further defines a first dummy pattern of the mask between an outermost active pattern in the first direction among the plurality of active patterns and an end of the mask, the first dummy pattern defining a third thickness of the mask between the first thickness and the second thickness.

2. The mask of claim 1, wherein the mask main body further defines a plurality of first dummy patterns of the mask between an outermost active pattern in the first direction among the plurality of active patterns and an end of the mask, the plurality of first dummy patterns defining a third thickness of the mask between the first thickness and the second thickness.

3. The mask of claim 1, wherein
 a plurality of first dummy openings are defined in the first dummy pattern, and
 a first distance between neighboring active openings is less than a second distance between neighboring first dummy openings.

4. The mask of claim 1, wherein the main mask body further defines:
 a second dummy pattern of the mask between neighboring active patterns among the plurality of active patterns.

5. The mask of claim 4, wherein
 the second dummy pattern defines the second thickness of the mask.

6. The mask of claim 4, wherein
 the second dummy pattern defines the third thickness of the mask.

7. The mask of claim 4, wherein the main mask body further defines a plurality of second dummy patterns of the mask respectively between neighboring active patterns from among the plurality of active patterns.

8. The mask of claim 4, wherein
 a plurality of second dummy openings are defined in the second dummy pattern, and
 a first distance between the neighboring active openings is less than a third distance between neighboring second dummy openings.

* * * * *